United States Patent [19]

Mayrand

[11] Patent Number: 4,458,158
[45] Date of Patent: Jul. 3, 1984

[54] IC INCLUDING SMALL SIGNAL AND POWER DEVICES

[75] Inventor: James F. Mayrand, Shrewsbury, Mass.

[73] Assignee: Sprague Electric Company, North Adams, Mass.

[21] Appl. No.: 271,724

[22] Filed: Jun. 8, 1981

Related U.S. Application Data

[63] Continuation-in-part of Ser. No. 019,971, Mar. 12, 1979, Pat. No. 4,272,307.

[51] Int. Cl.$^3$ ............................................. H01L 27/04
[52] U.S. Cl. ...................................... 307/270; 357/13; 357/46; 357/90; 357/92; 357/86; 148/175; 148/191
[58] Field of Search ................. 357/44, 46, 48, 89, 357/90, 92, 13; 307/270

[56] References Cited

U.S. PATENT DOCUMENTS

| | | | |
|---|---|---|---|
| 3,335,341 | 8/1967 | Lin | 307/303 |
| 3,502,951 | 3/1970 | Hunts | 357/48 |
| 3,649,887 | 3/1972 | Keller | 357/48 |
| 4,007,474 | 2/1977 | Yagi et al. | 357/34 |
| 4,038,680 | 7/1977 | Yagi et al. | 357/48 |
| 4,087,900 | 5/1978 | Yiannoulos | 357/48 |
| 4,144,098 | 3/1979 | Roesner | 357/92 |
| 4,228,448 | 10/1980 | Lalumia et al. | 357/46 |
| 4,240,846 | 12/1980 | Doyle | 357/89 |
| 4,260,999 | 4/1981 | Yoshioka | 357/48 |

FOREIGN PATENT DOCUMENTS

| | | | |
|---|---|---|---|
| 54-13279 | 1/1979 | Japan | 357/92 |
| 55-62762 | 5/1980 | Japan | 357/44 |

OTHER PUBLICATIONS

Kindl, IBM Tech. Discl. Bull., vol. 21, No. 2, Jul. 1978, pp. 494–497.
Okabe et al, "Compatible Analog and Digital Technology", 1978 IEEE International Solid-State Circuits Conference, Digest of Tech. Papers, pp. 44–45.

*Primary Examiner*—William D. Larkins

[57] ABSTRACT

An integrated circuit having first and second N-type epitaxial layers grown over a P-type silicon substrate includes PN junction isolated pockets. In at least one pocket is a small signal device, namely an I$^2$L transistor. In an adjacent pocket is a vertical NPN power transistor wherein the base is a P-type buried layer extending upward out of an N-type buried layer, both of which are grown from the substrate surface. The upward diffusion of the base region is substantially terminated at the interface between the epitaxial layers and thus the base width and charge are precisely controllable. Connected in the up-beta power transistor mode, the gain is precisely controllable independent of process variations made to control small signal devices. In the down-beta mode and connected as a diode with base and collector shorted, an excellent clamp diode is made producing an unusually low parasite current in the substrate.

10 Claims, 6 Drawing Figures

IC INCLUDING SMALL SIGNAL AND POWER DEVICES

CROSS REFERENCE TO RELATED APPLICATION

This application is a continuation-in-part of U.S. patent application Ser. No. 019,971 filed Mar. 12, 1979 now U.S. Pat. No. 4,272,307 to be issued June 9, 1981.

BACKGROUND OF THE INVENTION

This invention relates to integrated circuits that include small signal transistors and a high power handling device, and more particularly pertains to such an integrated circuit wherein the power device is a diode having a high reverse breakdown voltage and is capable of handling large forward currents without creating parasite currents in the substrate that would interfere with the operation of the small signal transistors.

It is known to make an integrated circuit with two epitaxial layers wherein a power transistor is formed in one epitaxial pocket and an inverted I$^2$L transistor is formed in another. A lower buried layer at the substrate is substantially spaced from the base of the power transistor to provide in the power transistor a high $BV_{CEO}$. An upper buried layer at the interface of the two epitaxial layers reaches the depletion region of the forward biased base-emitter junction to obtain enhanced up-gain by the conventional mechanisms of increasing the ratio of the impurity concentrations in the emitter and base, respectively. This ratio and thus the up-gain of such prior art I$^2$L transistors is subject to change as a function of variations in the upper epitaxial growth step and the impurity doping and driving steps needed to form other regions in the integrated circuit. The bases of all the transistors are simultaneously formed in one masking and one impurity diffusion step. Also, the power transistor emitter is formed simultaneously with the collector(s) of the inverted transistor.

In the practice of the aforementioned prior art, the control of the depth of the power transistor emitters and inverted transistor collectors tends to be critical and a compromise is made whereby the base width in the power transistor must remain large enough to prevent punch through and the approximately same base width in the inverted transistor must be shallow enough to provide adequate up-current gain in the inverted transistor. This problem is partially overcome by establishing the upper buried layer closely adjacent to the base of the inverted transistor and by using a fast diffusing n-type impurity (e.g. phosphorous) in the upper buried layer, to diminish the base width and to increase the aforementioned up-gain, but thereby entailing even more precise control of the process. The actual breakdown voltage $BV_{CEO}$ of the power transistor in many instances must be made close to the intended operating collector voltage while the gain of the inverted transistor is just sufficient to insure reliable I$^2$L gate operation. More generally the extent of impurity diffusions, impurity concentrations, and the upper buried layer thicknesses all tend to be critical.

Moreover, the power transistor cannot be converted to a high current high voltage diode because the emitter to base diode has a low breakdown voltage while the power transistor base to collector diode forms an emitter base junction in a parasitic transistor wherein the substrate serves as the parasitic transistor collector.

It is an object of the present invention to provide an integrated circuit that includes a small signal transistor and a power device capable of being used as a clamping diode for handling relatively large amounts of power without producing substrate currents that may be disruptive to the performance of the small signal transistors.

SUMMARY OF THE INVENTION

A high power handling device and a relatively small low power transistor are formed in one and another double epitaxial layer pockets of an integrated circuit. The power device has a first N-type buried layer extending only partially into the first of the epitaxial layers from the interface between the substrate and the first epitaxial layer. A P-type buried layer extends, from the interface within the first N-type buried layer, beyond that first buried layer and into the lightly doped epitaxial pocket. An annular P-type sub-isolation wall extends from the outer surface of the second epitaxial layer to the P-type buried layer enclosing an epitaxial sub-pocket. A heavily doped N-type region at the surface of this sub-pocket forms an N+N junction that is preferably within one holes diffusion length in the light doped sub-pocket from the buried P-type layer to provide higher emitter efficiencies when the device is used as a down-beta power transistor.

The power device of this invention may be viewed as a vertical NPN transistor (heavily doped surface region, buried P base region and first buried N region, respectively). The preferred process for making this device includes a predeposition of N-type impurities at the substrate surface, driving these impurities part way into the substrate to obtain a uniform predictable impurity source at the substrate surface prior to forming the first epitaxial layer, implanting a precise amount of P-type impurities into the substrate surface, growing the first epitaxial layer and driving the P-type dopants about to the surface of the first epitaxial layer. Now in subsequent relatively low temperature processing for forming the rest of the power device and for simultaneously forming the small signal transistors in adjacent pockets, no substantial diffusion of the buried P-type impurities will extend into second epitaxial layer. In this way the power device of this invention has a base whose thickness and total impurity charge is precisely controllable, and is only slightly affected by adjustments of the relatively low temperature/time steps used to form a small signal transistor. When the power device is used as an up-beta transistor, the current gain may be precisely controlled. When used as a down-beta transistor the gain is likewise precisely controllable. The down-beta transistor having base connected to collector forms a diode having especially unique properties. The close gain control feature leads to close control of the forward diode drop characteristic as well as providing close control over the exceptionally low holes injection from the base to the buried layer collector that tend to create unwanted parasite currents in the substrate.

DESCRIPTION OF THE PREFERRED EMBODIMENTS

Figure 1:
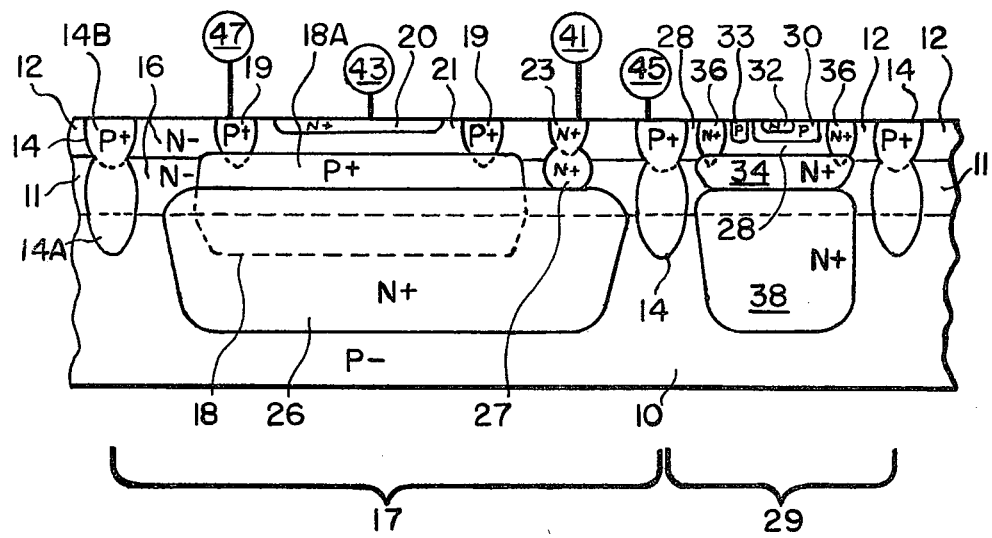
FIG. 1 shows in side sectional view a portion of an integrated circuit of this invention including a power transistor and an I$^2$L transistor. The vertical dimensions are shown essentially to scale.

The integrated circuit shown in FIG. 1 has a P-type substrate 10 and two N-type epitaxial layers 11 and 12. A system of P-type isolation walls 14 defines an electrically isolated pocket 16 in which there is formed a power transistor 17 utilizing the dual epitaxial pocket (16) material as a collector and having a P-type base 18A and an N-type contact region 20. An annular P-type sub-isolation wall 19 encloses and defines a sub-pocket 21 of epitaxial material that contains the contact region 20, the N regions 20 and 21 together serving as the emitter of the power transistor. A heavily doped N-type contact region 23 serves to provide a means for making ohmic contact to the portion of the epitaxial pocket 16 lying outside the sub-isolation wall 19 and serves as the collector contact. An N-type buried layer 26 is formed at the interface between substrate 10 and first epitaxial layer 11 extending laterally beyond the P-type buried layer 18. Buried layer 18 is overlapped and preempted there by the more heavily N-doped buried layer 26. The remaining P+ region 18A is the power transistor base. A buried partial plug region 27 reduces the collector resistance. For lowest collector resistance it is preferred that regions 27 and 23 meet, but this is not essential.

The isolation walls 14 also define an epitaxial pocket 28 wherein an I²L type inverted transistor 29 is formed having a P-type base region 30, an N-type collector region 32. A P-type injector region 33 lies adjacent to and spaced from the base region 30. An elevated or upper buried layer 34 of N-type is formed in pocket 28 at the interface between epitaxial layers 11 and 12. An N-type guard ring 36 surrounds the base 30 and may but does not necessarily contact the buried layer 34. Another deeper buried layer 38 of N-type, positioned at the interface of the pocket 28 and the substrate 10, abuts the upper buried layer 34, but is not essential.

Integrated circuit chips of the above described kind are made as follows: A silicon wafer 10 having a crystal orientation 111 and containing about $10^{14}$ P-type impurity atoms per cubic centimeters has a thick oxide layer grown over the surfaces. The oxide is photolithographically opened in the regions corresponding to the buried layers 26 and 38. The wafer is then heated to 1250° C. in an atmosphere containing antimony atoms which were further driven in by diffusion at 1250° C. for 5 hours. An oxide is then grown in windows corresponding to regions 26 and 38 for 80 minutes at 1150° C. The oxide is then photolithographically opened in regions 14 and 18. After growing a thin oxide at 900° C. for 12 minutes in these openings, a boron charge of $7 \times 10^{14}$ atoms per cm² is implanted at 50 KeV into the face of the substrate 10 through the thin oxide. The P buried layer 18 is then driven at 1175° C. for 1 hour. The oxide is chemically removed and an epitaxial layer 11 of about seven microns thickness and containing about $2 \times 10^{15}$ N-type impurity atoms per cubic centimeter is grown over the wafer surface. About 0.5 micron of silicon is etched off and the epitaxial layer 11 is then grown by the well known method of heating (for 17 minutes at 1200° C.) and exposing the substrate 10 to a gaseous mixture containing a silicon precursor compound, namely silicon tetrachloride, and a gaseous precursor of dopant impurities of N-type polarity, namely phosphine.

A thick oxide mask is then formed over the surface of epitaxial layer 11 with an opening in the regions of the partial plug 27 and the upper buried layer 34. The substrate is heated at 1225° C. for 80 minutes in the presence of antimony impurities that are diffused (from gaseous antimony trioxide) through the mask openings into the epitaxial layer 11. The substrate is then heated to drive these antimony impurities at 1150° C. for 45 minutes. The masking oxide is then removed and the wafer subjected to the same epitaxial growth steps as described above to form the epitaxial layer 11. Epitaxial layer 12 thus has the same thickness and properties as that of layer 11, which is process-wise-convenient but not functionally necessary.

By masking again and heating at 1150° C. for 2 hours to diffuse boron through the epitaxial layer 12, the sub-isolation wall 19 and the isolation wall portions 14B are formed. The upper portion of the walls 14 need only be driven through the upper epitaxial layer 11. Subsequently, by conventional photolithographic masking and diffusion steps, phosphorous was diffused into the epitaxial layer 12 to form the N-type rings 36 and contact region 23.

The I²L base 30 as well as injector region 33, are then formed by providing a new mask, predepositing from a boron trioxide source a thin layer of boron atoms on the epitaxial surface 40 and heating for 50 minutes at 1130° C. to provide a base thickness of 2.5 microns and an average resistivity of 0.03 ohm-centimeters.

The process thus far described includes steps for forming all of the regions shown in FIG. 1 except steps for forming the collector region 32 of the I²L inverted transistor 29 and for forming contact region 20 in transistor 17. They are formed simultaneously. A new oxide mask is provided for this purpose and the substrate heated for 22 minutes at a temperature of 1070° C. in an atmosphere of phosphorous oxichloride ($POCl_3$).

Employing the above noted standard process steps, the depth of the base 30 is controlled to within ±0.1 micron, the upward extent of the upper buried layer 34 is controlled to within ±0.1 micron, and the minimum thickness of the upper epitaxial layer 12 is controlled to within ±0.5 micron (at 1 standard deviation). Thus the minimum spacing between regions 34 and 32 can be set by the diffusion depth of layer 20 which provides about 4 microns for reverse bias depletion region build-up in the low dopant concentration portion of the emitter (21). Note also that a standard emitter diffusion can be used for layer 20 increasing the diode breakdown voltage but also increasing the hole currents in wall regions 14 surrounding the diode. Such parasite wall and substrate currents tend, of course, to interfere with the operation of adjacent small signal transistors and to increase power dissipation.

The heating steps in this process prior to growing the second epitaxial layer have a relatively high average duration and temperature, are in sum capable of promoting deep diffusions of doped regions (e.g. regions 14A, 18, 26 and 38). However, the remainder of the heating steps are typical of the mild standard shallow diffusion steps commonly used in making small signal transistors. This makes possible a high packing density of integrated components of all kinds including power devices in deep epitaxial pockets.

Also, the antimony deposit and drive sequence for layers 27 and 34 includes a time and temperature that is effective to further drive the boron in layers 18 and 14A to or near the surface of layer 11 prior to forming epitaxial layer 12. In the particular method described above, the subsequent heating steps are relatively short and mild and the thickness of layer 11 very nearly establishes the upward extent of the diffusion of the buried P layer 18, being little affected by variations in the subsequent mild heating steps. Furthermore, since the upward diffusions of both the N-type buried layer 26 and the P-type layer 18 are directly related to the time and temperature for growing the first epitaxial layer 11, the width of base 18A is only a weak function of variations in that step. Since the dose of P-type impurities in the buried layer 18 can be closely controlled, then so can the total charge in the base 18A (corresponding to the Gummel number) be closely controlled within a wide range of possible values, while leaving much latitude in the choice of small signal transistor process steps that may follow.

The gain of the power transistor in pocket 16 is therefore unusually insensitive to normal variations in manufacturing process steps. This transistor gain is also easily adjusted by changing the implant dose for forming the P-type layer 18. An increase in the number of boron atoms implanted causes a decrease in the current gain and a lesser decrease in the emitter-base breakdown voltage.

The power transistor 17 is ideally suited for use as a high voltage high current power diode. It has a high base emitter breakdown voltage due to the light emitter-dopant concentration (sub-pocket 21) and the transistor gain is easily controlled so that by shorting base to collector, almost all the resulting diode anode current is electrons in the collector 26 and few holes are available for injection into the substrate 10 or walls 14 to be collected in epitaxial pockets (e.g. 28) of adjacent small signal transistors. The collector-base junction (e.g. 29) has a low characteristic breakdown voltage but this junction is substantially shorted in the diode application.

Figure 2:
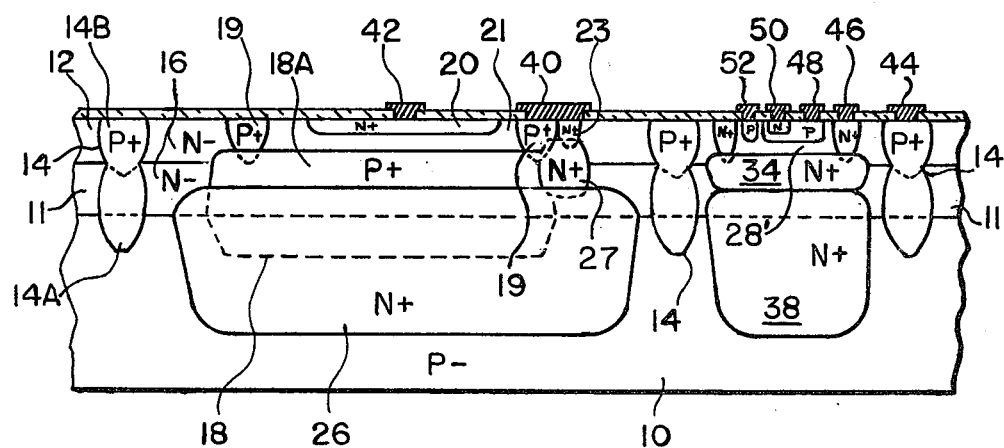
FIG. 2 shows in side sectional view a modified version of the intetrated circuit of FIG. 1 wherein the power transistor is connected as a power diode.

With reference to FIG. 2, the N+ collector plug made up of regions 23 and 27 are moved adjacent to the P-type sub-isolation wall 19 and are shorted at the outer surface of upper epitaxial layer 12 by film 40 which serves as the diode anode lead. The cathode lead is comprised of metal film 42 contacting region 20. Other metal films 44, 46, 48, 50 and 52 provide electrical access respectively to the substrate 10, and I²L transistor regions 36, 30, 32 and 33 that are identified in FIG. 1.

Figure 3:
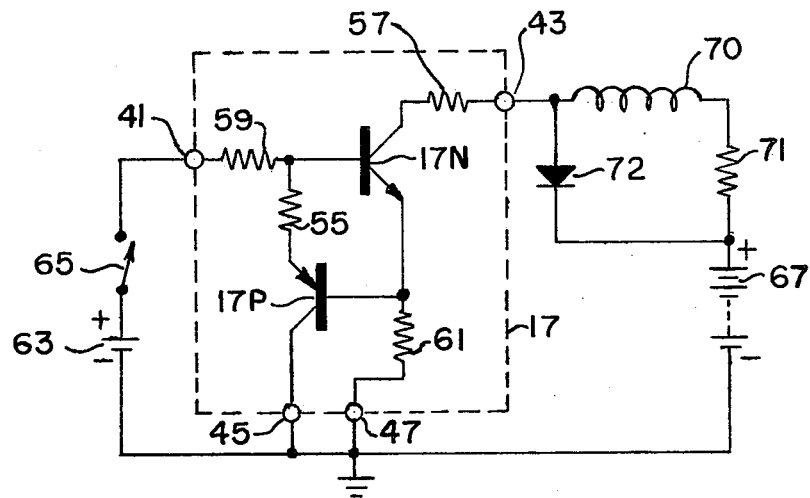
FIG. 3 shows a diagrammatic representation of the power transistor of FIG. 1, connected for driving an inductive load.

Referring to FIG. 3, an equivalent circuit for transistor 17 is shown circumscribed by a dashed line. The power NPN transistor 17N is represented as an up-beta transistor wherein, with reference to FIG. 1, the emitter is the buried layer 26, the base is region 18A and the collector is the sub-epitaxial pocket 21 with the heavily doped N-type region 20 serving as the collector contact region. In the parasitic PNP transistor 17P, the emitter and base share regions 18A and 26 with the NPN transistor 17N. It is well known that in such a junction (across regions 26 and 18A) hole current is substantially less than the electron current and thus to account in the equivalent circuit 17 for the expected lower current in the emitter base junction of PNP transistor 17N than in the base-emitter junction of NPN transistor 17P a resistor 55 is inserted in series with the emitter of transistor 17P. The resistances associated with the collector, base and emitter of transistor 17N are represented by resistors 57, 59 and 61, respectively. In the preferred embodiment described above, the $\alpha$ of transistor 17P is on the order of 0.03 while that of 17N is about 0.99. These values are inversely proportional to the Gummel numbers of regions 26 and 18A, respectively, and are substantiated as being quite disparate by inspection in FIG. 1 of the relatively thick buried layer region 26 compared to the base region 18A. The advantage over a conventional down-$\beta$ (double diffused) NPN power transistor is that equipotential lines in the collector depletion region tend to be more nearly planar and lead to a higher $BV_{CB}$. Also, as has been noted, the gain is more easily controlled and independent of process variation needed for controlling adjacent small signal transistors. The power transistor 17 made by the process described above may have a breakdown voltage at least as high as 40 volts.

A battery 63 and switch 65, connected in series and across terminals 41 and 47 of transistor 17, illustrate a circuit means for turning on and off transistor 17. The battery 67 supplies collector voltage and the coil 70 with resistor 71 represents an inductive load, such as a solenoid or a motor. The voltage of battery 67 may be around 70 volts using the transistor 17 described above. The reverse breakdown voltage is dropped across the collector base junction, namely between region 18A and 21. However, when in the circuit of FIG. 3 the transistor 17 is turned off, a back voltage develops across coil 70 that is series aiding with that of the battery 67. Unless the inductance of coil 70 is very small this can be a very large voltage tending to break down transistor 17. A clamp diode 72 prevents such destructive voltages, diverting the inductive kick-back current from the transistor 17.

The transistor 17 of FIG. 1, having the terminal 43 connected to the base terminal 41 as illustrated in FIG. 2 will provide such a high voltage clamp diode (as 72 FIG. 3) capable of handling large inductive kick-back currents in the same integrated circuit as the power transistor.

Figure 4:
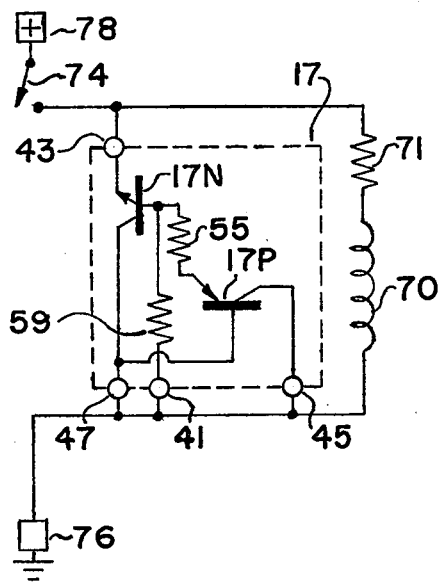
FIGS. 4 and 5 shows another diagrammatic representation of the power transistor of FIG. 1, connected in two ways respectively for shunting the fly back current from a switched inductive load.
Figure 5:
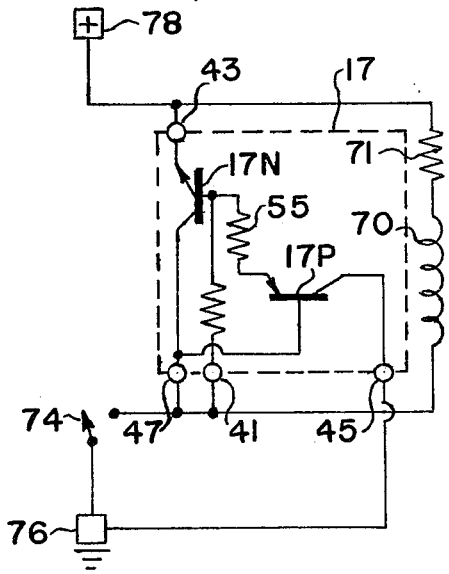

In each of FIGS. 4 and 5, the transistor 17 is represented by an equivalent circuit enclosed by a dashed line. The power NPN transistor 17N is represented as a down-beta transistor wherein, with reference to FIG. 1, the emitter is the lightly doped sub-pocket 21 with region 20 as the contact region therein, the base region is region 18A and the collector is buried layer 26. Terminals 41 and 47 are connected together essentially shorting the base and collector of the NPN transistor 17N. The resulting clamp diode has anode terminal 47 and cathode terminal 43, and it is connected across the load made up of inductor 70 and resistor 71. Switch 74 connects and disconnects that inductive load across DC power supply terminals 76 and 78. In both circuits, the substrate terminal 45 is connected to the negative power supply terminal 76. In this down-beta mode, it is preferred to form a "low emitter impurity concentration (LEC)" type emitter wherein the N+N junction of regions 20 and 21 is spaced within one holes diffusion length in region 21 from the P-type base region 18A. This provides high emitter efficiency, and thus greater transistor gain that leads to a diode having a lower forward drop characteristic. This also reduces the base current, pinch effect in the base, and improves the safe operating area of the diode.

In FIGS. 4 and 5, the switch 74 may represent a power transistor of the up-beta type shown in FIG. 1 or a down-beta type power transistor as described in the above-identified parent patent application. These transistors are all capable of being made as disclosed, by compatible processes in the same integrated circuit including economic simultaneous process steps to form portions of small signal and power transistors, and the parent patent application is accordingly incorporated by reference herein. The up-beta of the present invention is however preferred for its more easily controlled gain and superior breakdown properties.

Although in the preferred embodiment described, the small signal transistor is illustrated by an I²L transistor, the well known diffusion processes for making conventional vertical integrated NPN transistors and lateral PNP transistors are now obviously compatible with that for making a power transistor 17. Further, a similar process compatability exists with certain low temperature and heating time MOS processes such as that described in the patent to Miles and Emerald, U.S. Pat. No. 4,225,877 issued Sept. 30, 1980 and assigned to the same assignee as is the present invention. The latter patent is also incorporated by reference herein for showing small signal devices that are capable of being made simultaneously with the power transistor 17 of this invention.

Figure 6:
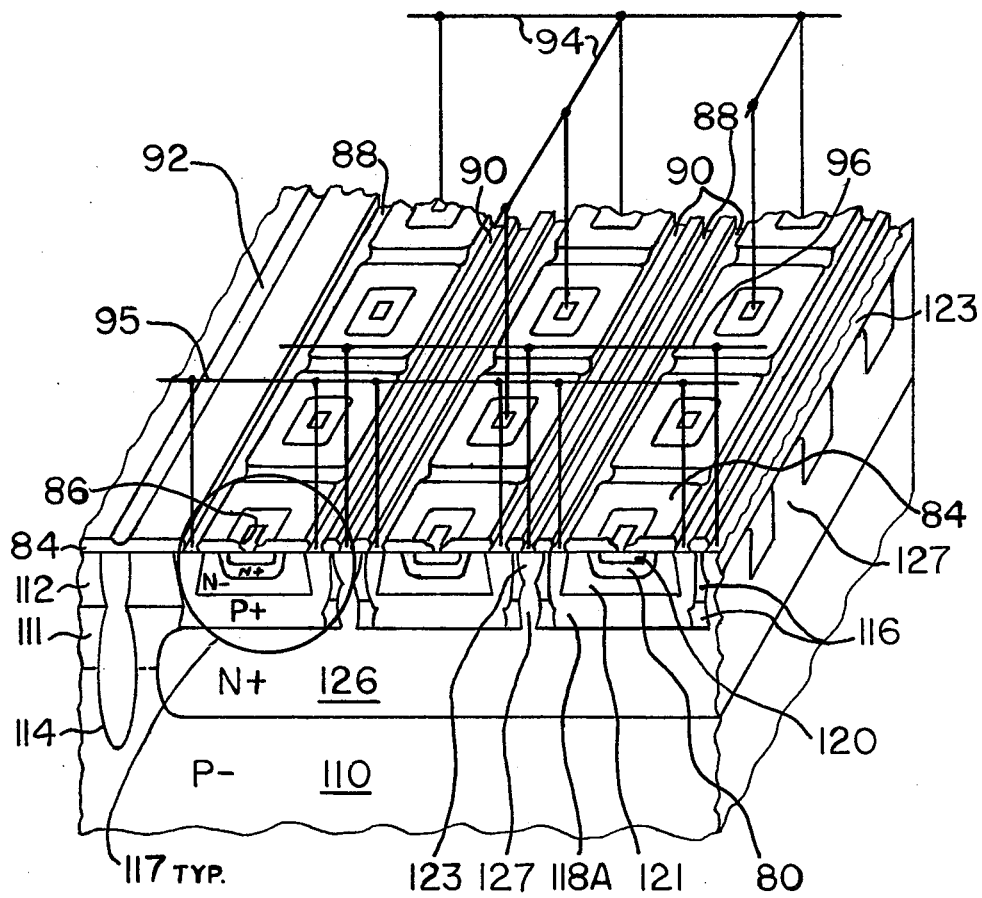
FIG. 6 shows in perspective view a portion of an array of power devices of this invention that may be connected as a composite power device.

With reference to FIG. 6, the interconnected integrated circuit array of power transistors 117 provides a higher base periphery and less voltage drop in the base than for the single transistor 17 when the latter occupies the same silicon substrate area. The elements of each transistor 117 have corresponding elements in the transistor 17 of FIG. 1, the numeral designations of the former being chosen to be greater by 100 than those of the latter. Further, each transistor 117 in the array additionally has a N+ region 80 that is formed simultaneously with the N+ contact regions 123 that, via regions 127, provides electrical access from the wafer surface to the buried layer 126.

An insulative silicon dioxide layer 84 is deposited over the epitaxial silicon surface and holes 86 are opened in the oxide over each of the regions 120. Slots 88 are opened in the oxide between the column of array transistors 116 for contacting regions 123. Also slots 90 are opened in the oxide layer adjacent slots 88 for contacting region 118A. A slot 92 is formed over isolation walls 114 for contacting the isolation walls 14 and substrate 10.

A conventional single layer selective metallization is represented by the partially constructed conductive grids 94, 95 and 96. Grid 94 connects, via holes 86, all regions 120 together, e.g. to form the cathode terminal for an arrayed clamping diode of this invention. Grid 95 connects, via slots 90, the base regions 118A together. Grid 96 connects, via slots 88, all the contact regions 123 making a highly conductive contact to the buried layer 126.

The second N+ buried layer 127 is also broken into separate segments as seen in the right hand side of FIG. 6. This feature provides in the arrayed composite power transistor, operated in the up-beta mode, a ballasted emitter for more even current distribution, a technique known in forming down-beta power transistors. This ballasting feature raises the breakdown voltage because there is less "pinch" effect in the N+ buried layer 26 and thus a more uniform voltage appearing across every portion of the P-N junctions formed between layers 126 and 118A.

For the power diode use, the anode may be comprised of parallel fingers of metal film (not shown) overlying the regions 120 which are interdigitated with another set of metal film fingers (not shown) overlying the columnar regions between the transistors and contacting both the regions 118A and 123 via both systems of slots 88 and 90.

What is claimed is:

1. An integrated circuit comprising a P-type silicon substrate; a first and second lightly doped N-type epitaxial layers grown over one face of said substrate, one and another isolated epitaxial pockets formed in said epitaxial layers and bounded by said substrate; a high power device and a relatively small low power transistor being formed in said one and another pockets, respectively;

said high power device comprising a first N-type buried layer having been heated and driven from the interface, between said substrate and said first epitaxial layer, deeply downward into said substrate but substantially less deeply upward and only partially through said first epitaxial layer in said one pocket;

a P-type buried layer extending upward from said interface and through an inner region of and only slightly beyond said first N-type buried layer and into said one epitaxial pocket but not downward beyond said buried N-type layer into said P-type substrate;

an annular P-type sub-isolation wall extending from the outer surface of said second epitaxial layer to said P-type buried layer, enclosing an epitaxial sub-pocket therewithin;

a shallow heavily doped N-type region in said sub-pocket surface forming an N+N junction therewith, said N+N junction being spaced from said P-type buried layer by less than a holes diffusion length in said lightly doped sub-pocket;

said low power transistor comprising at least one doped region extending into said first and second epitaxial layers from the common boundary there between.

2. The integrated circuit of claim 1 wherein said high power device additionally comprises an N-type plug, that is exterior to said sub-isolation wall, having an outer region extending downward from the outer surface of said second epitaxial layer and an inner portion extending away from said common boundary upward to said outer region and downward to said second N-type buried layer.

3. The integrated circuit of claim 1 wherein the PN junction formed between said P-type buried layer and said lightly doped epitaxial sub-pocket has a reverse breakdown voltage in excess of 40 volts.

4. The integrated circuit of claim 1 wherein the relative diffusion rate of the P-type impurities in said P-type buried layer is greater than that of the N-type impurities in said first N-type buried layer.

5. The integrated circuit of claim 1 additionally comprising an N+ contact region in said first pocket exterior to said sub-isolation wall.

6. The integrated circuit of claim 5 wherein a plurality of said high power devices form an array in said one pocket that share one of said first N-type buried layers, and additionally comprising a first conductor electrically connecting all of said heavily doped N-type regions together, a second conductor connecting all of said P-type sub-isolation walls together, and a third conductor connecting said N+ contact regions together to form a composite power device.

7. The integrated circuit of claim 6 additionally comprising an N+ buried region extending from the boundary between said first and second epitaxial layers upward and downward to connect said N+ contact regions to said shared N-type buried layer and thereby form separate N-type plugs from said third conductor to said shared buried layer.

8. The integrated circuit of claim 7 wherein said N-type plug regions between said shared N-type buried layer and said third conductor are spaced apart from each other to provide current ballasting in said shared N-type buried layer.

9. The integrated circuit of claim 7 additionally comprising emitter, base and collector terminations ohmically connected to said N-type plug region, said P-type sub-isolation wall and said heavily doped N-type region, respectively, an inductive load in series with a DC power source being connected from said emitter to said collector termination so that said collector termination is positive, and means for repeatedly turning said power device on and off for switching said inductive load on and off, whereby said power device is an up-beta power transistor.

10. The integrated circuit of claim 14 additionally comprising conductive collector, base and emitter terminations ohmically connected to said N-type plug region, said P-type sub-isolation wall and said heavily doped N-type region, respectively, said base and collector terminations being connected together to form a diode anode termination, said emitter termination serving as a diode cathode termination.

* * * * *

UNITED STATES PATENT AND TRADEMARK OFFICE
CERTIFICATE OF CORRECTION

PATENT NO. : 4,458,158
DATED : July 3, 1984
INVENTOR(S) : James F. Mayrand

It is certified that error appears in the above-identified patent and that said Letters Patent is hereby corrected as shown below:

Claim 10, line 1, "claim 14" should read -- claim 7 --.

Signed and Sealed this

Fifth Day of February 1985

[SEAL]

Attest:

DONALD J. QUIGG

Attesting Officer     Acting Commissioner of Patents and Trademarks